United States Patent
Kameda et al.

(10) Patent No.: US 11,306,396 B2
(45) Date of Patent: Apr. 19, 2022

(54) OXIDE FILM FORMING DEVICE

(71) Applicant: MEIDENSHA CORPORATION, Tokyo (JP)

(72) Inventors: Naoto Kameda, Moriya (JP); Toshinori Miura, Chiba (JP); Mitsuru Kekura, Numazu (JP)

(73) Assignee: MEIDENSHA CORPORATION, Tokyo (JP)

(*) Notice: Subject to any disclaimer, the term of this patent is extended or adjusted under 35 U.S.C. 154(b) by 0 days.

(21) Appl. No.: 17/297,652

(22) PCT Filed: Sep. 5, 2019

(86) PCT No.: PCT/JP2019/034881
§ 371 (c)(1),
(2) Date: May 27, 2021

(87) PCT Pub. No.: WO2020/110406
PCT Pub. Date: Jun. 4, 2020

(65) Prior Publication Data
US 2022/0010432 A1 Jan. 13, 2022

(30) Foreign Application Priority Data
Nov. 30, 2018 (JP) .............. JP2018-225083

(51) Int. Cl.
*C23C 16/40* (2006.01)
*C23C 16/455* (2006.01)

(52) U.S. Cl.
CPC ...... *C23C 16/45565* (2013.01); *C23C 16/402* (2013.01); *C23C 16/45574* (2013.01); *C23C 16/45591* (2013.01)

(58) Field of Classification Search
CPC ............ C23C 16/45565; C23C 16/402; C23C 16/45574; C23C 16/45591
(Continued)

(56) References Cited

U.S. PATENT DOCUMENTS 6,200,389 B1 * 3/2001 Miller ............... C03C 17/002
                                                      118/715
6,521,048 B2 * 2/2003 Miller ............... C03C 17/002
                                                      118/715
(Continued)

FOREIGN PATENT DOCUMENTS

JP      05-198512 A     8/1993
JP      06-002150 A     1/1994
(Continued)

OTHER PUBLICATIONS

Korean Office Action and English translation, Application No. 10-2021-7019238, dated Aug. 23, 2021, 6 pages.
(Continued)

*Primary Examiner* — Rudy Zervigon
(74) *Attorney, Agent, or Firm* — Foley & Lardner LLP

(57) ABSTRACT

Disclosed is an oxide film forming device including a furnace body in which a workpiece is placed and a furnace cover. A mixed gas diffusion part is disposed on an inner side of the furnace cover via a shield plate. A mixed gas buffer space is provided in the mixed gas diffusion part. A shower head plate is disposed on the mixed gas diffusion part and opposed to the workpiece at a distance of 1 to 100 mm away from the workpiece. An ozone gas buffer space is provided in the furnace cover. A gas flow diffusion plate is disposed in the ozone gas buffer space. The shower head plate has formed therein first slits through which an ozone gas flows and second slits through which a mixed gas flows. The first slits and the second slits are alternately arranged side by side in a short-dimension direction of the slits.

4 Claims, 6 Drawing Sheets

(58) Field of Classification Search
USPC .................. 118/715; 156/345.33, 345.34
See application file for complete search history.

(56) References Cited

U.S. PATENT DOCUMENTS

| | | | | |
|---|---|---|---|---|
| 7,413,982 | B2* | 8/2008 | Levy | C23C 16/45519 438/680 |
| 7,456,429 | B2* | 11/2008 | Levy | H01L 29/76 257/66 |
| 7,789,961 | B2* | 9/2010 | Nelson | C23C 16/45519 118/715 |
| 7,850,780 | B2* | 12/2010 | Levy | C23C 16/45551 118/715 |
| 8,211,231 | B2* | 7/2012 | Kerr | C23C 16/45574 118/715 |
| 8,398,770 | B2* | 3/2013 | Levy | C23C 16/45519 118/718 |
| 8,420,168 | B2* | 4/2013 | Kerr | C23C 16/45551 427/248.1 |
| 8,636,847 | B2* | 1/2014 | Belousov | C23C 16/45574 118/715 |
| 8,697,197 | B2* | 4/2014 | Savas | C23C 16/45504 427/569 |
| 8,915,999 | B2* | 12/2014 | Okesaku | H01J 37/32477 118/715 |
| 9,096,932 | B2* | 8/2015 | Savas | C23C 16/40 |
| 9,096,933 | B2* | 8/2015 | Savas | H01L 21/67069 |
| 9,443,702 | B2* | 9/2016 | Savas | C23C 16/26 |
| 9,567,670 | B2* | 2/2017 | Sershen | C23C 16/45544 |
| 9,783,888 | B2* | 10/2017 | Sershen | C23C 16/45574 |
| 10,017,876 | B2* | 7/2018 | Belousov | C23C 16/4584 |
| 10,049,859 | B2* | 8/2018 | Savas | H01J 37/32449 |
| 10,351,954 | B2* | 7/2019 | Levy | H01L 21/02178 |
| 10,916,704 | B2* | 2/2021 | Hack | C23C 16/301 |
| 11,104,988 | B2* | 8/2021 | Quinn | C23C 14/12 |
| 11,121,320 | B2* | 9/2021 | Quinn | H01L 51/5004 |
| 11,136,667 | B2* | 10/2021 | Levy | C23C 16/4408 |
| 2001/0004881 | A1* | 6/2001 | Miller | C23C 16/4412 118/729 |
| 2007/0228470 | A1* | 10/2007 | Levy | C23C 16/45551 257/348 |
| 2007/0238311 | A1* | 10/2007 | Levy | C23C 16/45504 438/765 |
| 2008/0166880 | A1* | 7/2008 | Levy | C23C 16/45525 438/758 |
| 2009/0081366 | A1* | 3/2009 | Kerr | C23C 16/45551 427/255.28 |
| 2009/0081886 | A1* | 3/2009 | Levy | C23C 16/45551 438/790 |
| 2009/0130858 | A1* | 5/2009 | Levy | C23C 16/545 438/765 |
| 2009/0217878 | A1* | 9/2009 | Levy | C23C 16/45551 118/729 |
| 2009/0298267 | A1 | 12/2009 | Hashimoto | |
| 2010/0119727 | A1 | 5/2010 | Takagi | |
| 2010/0272895 | A1 | 10/2010 | Tsuda | |
| 2010/0300482 | A1 | 12/2010 | Miura | |
| 2010/0310771 | A1* | 12/2010 | Lee | C01B 21/076 427/255.28 |
| 2011/0005681 | A1* | 1/2011 | Savas | H01J 37/32036 156/345.33 |
| 2011/0005682 | A1* | 1/2011 | Savas | C23C 16/45504 156/345.34 |
| 2011/0006040 | A1* | 1/2011 | Savas | C23C 16/40 216/71 |
| 2011/0097487 | A1* | 4/2011 | Kerr | C23C 16/45551 427/248.1 |
| 2011/0097488 | A1* | 4/2011 | Kerr | C23C 16/545 427/248.1 |
| 2011/0097489 | A1* | 4/2011 | Kerr | C23C 16/45591 427/248.1 |
| 2011/0097490 | A1* | 4/2011 | Kerr | C23C 16/45551 427/248.1 |
| 2011/0097491 | A1* | 4/2011 | Levy | C23C 16/54 427/248.1 |
| 2011/0097492 | A1* | 4/2011 | Kerr | C23C 16/45574 427/248.1 |
| 2011/0098841 | A1 | 4/2011 | Tsuda | |
| 2012/0141676 | A1* | 6/2012 | Sershen | C23C 16/4584 427/255.23 |
| 2012/0219712 | A1* | 8/2012 | Kerr | C23C 16/45551 427/255.28 |
| 2013/0168462 | A1* | 7/2013 | Kerr | C23C 16/45574 239/1 |
| 2014/0212601 | A1* | 7/2014 | Savas | C23C 16/45591 427/576 |
| 2014/0220262 | A1* | 8/2014 | Savas | C23C 16/26 427/576 |
| 2015/0270109 | A1* | 9/2015 | Savas | H01L 21/67069 216/71 |
| 2015/0275363 | A1* | 10/2015 | Sershen | C23C 16/45544 118/730 |
| 2015/0368798 | A1* | 12/2015 | Kwong | C23C 16/45563 118/729 |
| 2015/0376787 | A1* | 12/2015 | McGraw | C23C 14/04 118/724 |
| 2016/0115596 | A1* | 4/2016 | Sershen | C23C 16/45551 239/124 |
| 2016/0153088 | A1 | 6/2016 | Tsuji et al. | |
| 2017/0029949 | A1* | 2/2017 | Levy | C23C 16/45527 |
| 2018/0079764 | A1 | 3/2018 | Harada et al. | |
| 2019/0186001 | A1* | 6/2019 | Lee | C23C 16/45536 |
| 2019/0305224 | A1* | 10/2019 | Hack | C23C 16/45574 |
| 2021/0222299 | A1* | 7/2021 | Noyori | C23C 16/45565 |

FOREIGN PATENT DOCUMENTS

| | | |
|---|---|---|
| JP | 2001-304756 A | 10/2001 |
| JP | 2003-020209 A | 1/2003 |
| JP | 2003-092290 A | 3/2003 |
| JP | 2003-092292 A | 3/2003 |
| JP | 2007-109984 A | 4/2007 |
| JP | 2008-244142 A | 10/2008 |
| JP | 2008-294170 A | 12/2008 |
| JP | 2009-088229 A | 4/2009 |
| JP | 2009-141028 A | 6/2009 |
| JP | 2009-191311 A | 8/2009 |
| JP | 2009-239082 A | 10/2009 |
| JP | 2013-207005 A | 10/2013 |
| JP | 2016-108655 A | 6/2016 |
| JP | 2016-210742 A | 12/2016 |
| KR | 10-2006-0084701 A | 7/2006 |
| TW | 2009-03638 A | 1/2009 |
| TW | 2009-35515 A | 8/2009 |
| WO | WO 2008/114363 A1 | 6/2010 |

OTHER PUBLICATIONS

Japanese Office Action and English translation, Application No. 2019-551404, dated Jan. 21, 2020.

Meidensha Corporation, Homepage, Internet, News Releases 2018, "Meiden Developed Technology for Oxide Film Formation at Room Temperature with Use of Pure Ozone" (online), Jul. 31, 2019.

Japanese Office Action and English translation, Application No. 2019-551404, dated Apr. 7, 2020.

Japanese Office Action and English translation, Application No. 2019-551404, dated Oct. 29, 2019.

* cited by examiner

OXIDE FILM FORMING DEVICE

FIELD OF THE INVENTION

The present invention relates to an oxide film forming device for forming an oxide film on a workpiece by supplying to the workpiece a raw material gas containing a constituent element of the oxide film.

BACKGROUND ART

On organic materials for use in packaging applications, electronic components, flexible devices and the like, it is common to form inorganic films for surface protection and functionality addition. Further, the flexibilization of various electronic devices is being studied where it is required to form the electronic devices on e.g. organic films. For these reasons, there have been made studies on low-temperature film forming techniques capable of forming films on low heat-resistant substrates such as organic films.

As film forming techniques, chemical vapor deposition (CVD) and physical vapor deposition (PVD) are known. These film forming techniques have been used for the formation of various insulating films, conductive films etc. in the manufacturing processes of fine electronic devices. In general, the chemical vapor deposition is superior in terms of the film deposition rate and covering property.

In the chemical vapor deposition, a film is formed on a workpiece by reacting a raw material gas containing a film constituent element-containing compound (such as, for example, silane (that is a generic name for hydrogen silicate), TEOS (tetraethyl orthosillicate), TMA (trimethyl aluminum) or tungsten fluoride ($WF_6$)) with the addition of a reactive gas and depositing the resulting reaction product on the workpiece. This chemical vapor deposition technique is performed under high-temperature conditions of several hundreds ° C. or higher in order to promote the reaction between the gases and to improve the quality of the film on the workpiece. In other words, the chemical vapor disposition is difficult to perform under low-temperature conditions. The temperature of the chemical vapor deposition often exceeds the heat resistant temperatures of organic materials.

As an example of the application of a high-concentration ozone gas to the chemical vapor deposition technique, there is known a method by which a $SiO_2$ film is formed on a substrate with the use of a high-concentration ozone gas and a TEOS gas under high-temperature conditions of several hundreds ° C. or higher (see Patent Document 1).

In order to form a film with good quality by chemical vapor deposition under low-temperature conditions, it is necessary to introduce a reactive species which has a high chemical reactivity even under low-temperature conditions. For example, there are known: a method in which a coating film deposited on a workpiece is oxidized at a temperature of 100° C. or lower (see Patent Document 2); and a method in which an ashing reaction for removal of organic substances is conducted at room temperature (see Patent Documents 3 and 4). Each of these methods realizes a film forming process at a temperature of 200° C. or lower with the use of a reactive species generated through reaction of high-concentration ozone and unsaturated hydrocarbon.

PRIOR ART DOCUMENTS

Patent Documents
  Patent Document 1: Japanese Laid-Open Patent Publication No. 2007-109984
  Patent Document 2: Japanese Laid-Open Patent Publication No. 2013-207005
  Patent Document 3: Japanese Laid-Open Patent Publication No. 2008-294170
  Patent Document 4: Japanese Laid-Open Patent Publication No. 2009-141028
  Patent Document 5: Japanese Laid-Open Patent Publication No. 2009-191311
Non-Patent Documents
  Non-Patent Document 1: Meidensha Corporation, Homepage, Internet, News Releases 2018, "Meiden Developed Technology for Oxide Film Formation at Room Temperature with Use of Pure Ozone" (online), Jul. 31, 2019

SUMMARY OF THE INVENTION

As a result of extensive researches, the present inventors found a method of forming an oxide film on a workpiece by reacting a CVD raw material gas with a reactive species generated through reaction of an ozone gas and an unsaturated hydrocarbon (see Non-Patent Document 1).

In this method, the CVD film forming process takes place in the vicinity of where the ozone gas, the unsaturated hydrocarbon and the raw material gas are mixed together. There is hence a possibility that a thickness deviation occurs in the oxide film formed on the workpiece.

The present invention has been made in view of the above circumstance. It is accordingly an object of the present invention to provide a technique for, during formation of an oxide film on a workpiece by reaction of an ozone gas, an unsaturated hydrocarbon gas and a raw material gas, reducing a deviation in the thickness distribution of the oxide film.

In accordance with one aspect of the present invention to achieve the above object, there is provided an oxide film forming device for forming an oxide film on a workpiece, comprising: a treatment furnace in which the workpiece is placed; and a shower head arranged facing a treatment target surface of the workpiece, wherein the shower head comprises first holes for supplying an ozone gas to the workpiece and second holes for supplying to the workpiece an unsaturated hydrocarbon gas, a raw material gas containing a Si element or metal element which is a constituent element of the oxide film, or a mixed gas of the unsaturated hydrocarbon gas and the raw material gas, wherein a gas supply surface of the shower head is opposed to the treatment target surface of the workpiece at a distance of 1 mm to 100 mm away from the treatment target surface, wherein the first holes and the second holes have a diameter larger than or equal to 0.1 mm and smaller than or equal to 10 mm, and wherein an interval between adjacent ones of the first holes and an interval between adjacent ones of the second holes are larger than or equal to 1 mm and smaller than or equal to 100 mm.

The treatment furnace may comprise a first gas supply port for supplying therethrough the ozone gas and a second gas supply port for supplying therethrough the unsaturated hydrocarbon gas, the raw material gas or the mixed gas, with a first gas buffer space fowled between the first gas supply port and the shower head to allow diffusion of the ozone gas and a second gas buffer space formed between the second gas supply port and the shower head to allow diffusion of the unsaturated hydrocarbon gas, the raw material gas or the mixed gas.

The first holes may be evenly spaced in a rectangular grid arrangement in two directions perpendicular to each other along the treatment target surface; and the second holes may be evenly spaced in a rectangular grid arrangement, in directions respectively parallel to the two directions, at positions displaced from the first holes along the treatment target surface.

The first holes may be provided along an outer periphery of the shower head.

The shower head may be in the four of a plate and detachably disposed in the treatment furnace.

In accordance with another aspect of the present invention to achieve the above object, there is provided an oxide film forming device for forming an oxide film on a workpiece, comprising: a treatment furnace in which the workpiece is placed; and a shower head arranged facing a treatment target surface of the workpiece, wherein the shower head comprises first slits for supplying an ozone gas to the workpiece and second slits for supplying to the workpiece an unsaturated hydrocarbon gas, a raw material gas containing a Si element or metal element which is a constituent element of the oxide film, or a mixed gas of the unsaturated hydrocarbon gas and the raw material gas, wherein the first slits and the second slits are alternately arranged side by side in a short-dimension direction of the slits, wherein a gas supply surface of the shower head is opposed to the treatment target surface of the workpiece at a distance of 1 mm to 100 mm away from the treatment target surface, wherein the first slits and the second slits have a slit width larger than or equal to 0.1 mm and smaller than or equal to 10 mm, and wherein an interval between slit centers of adjacent ones of the first slits and an interval between slit centers of adjacent ones of the second slits are larger than or equal to 1 mm and smaller than or equal to 100 mm.

The present invention produces the effect of, at the time of forming the oxide film on the workpiece by reaction of the ozone gas, the unsaturated hydrocarbon gas and the raw material gas, reducing a deviation in the thickness distribution of the oxide film.

DESCRIPTION OF EMBODIMENTS

Hereinafter, oxide film forming devices according to exemplary embodiments of the present invention will be described in detail below with reference to the drawings. Each of the exemplary embodiments specifically refers to the case of using an ozone gas with an ozone concentration of 100 vol %, an ethylene gas as an unsaturated hydrocarbon gas, a TEOS gas as a raw material gas and a nitrogen gas as a carrier gas. It is however possible in the present invention to form an oxide film in the same manner as in the exemplary embodiments even in the case of using an ozone gas with a different ozone concentration, any other unsaturated hydrocarbon gas, any other raw material gas and any other carrier gas as will be described later.

Figure 1:
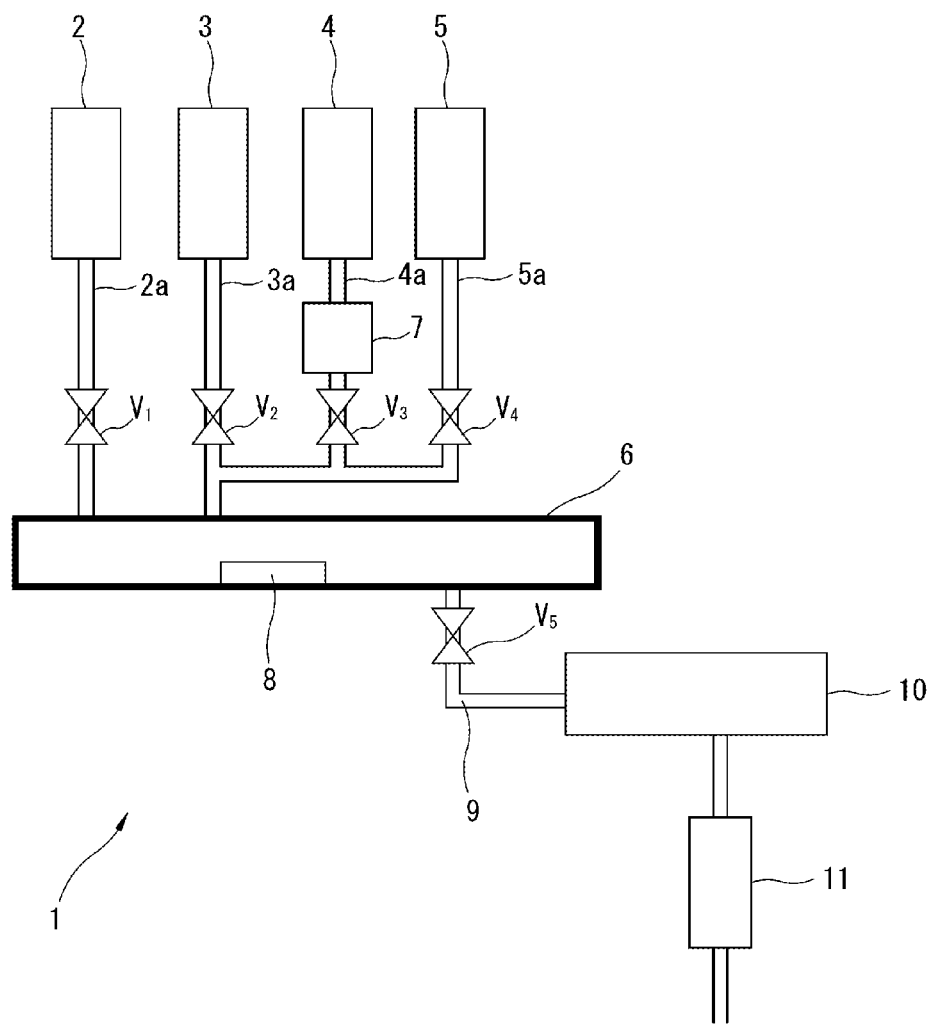
FIG. 1 is a schematic view of an oxide film forming device according to a first embodiment of the present invention.

As shown in FIG. 1, the oxide film forming device 1 according to the first embodiment of the present invention includes an ozone gas generator 2 (or a cylinder filled with a high-concentration ozone gas), an ethylene gas cylinder 3, a TEOS gas cylinder 4, a nitrogen gas cylinder 5 and a treatment furnace 6 (chamber) for film deposition treatment.

The ozone gas generator 2 is arranged to supply an ozone gas to the treatment furnace 6. The ozone gas generator 2 is connected to the treatment furnace 6 via a pipe 2a. A variable flow rate valve $V_1$ is mounted to the pipe 2a so as to individually control the flow rate of the ozone gas. The flow rate of the ozone gas in the pipe 2a is measured based on e.g. a difference between primary and secondary pressures of the valve $V_1$ and a cross-sectional area of the pipe 2a. In this way, the flow rate measurement of the ozone gas is preferably carried out using a device system that measures a flow rate based on a pressure difference. This is because the use of a heating-type measurement device leads to decomposition of the ozone gas.

The ethylene gas cylinder 3 is arranged to supply an ethylene gas to the treatment furnace 6. The ethylene gas cylinder 3 is connected to the treatment furnace 6 via a pipe 3a. A variable flow rate valve $V_2$ is mounted to the pipe 3a so as to individually control the flow rate of the ethylene gas. Although not specifically shown in the drawing, the pipe 3a is equipped with a measurement device such as mass flow meter for measuring the flow rate of the ethylene gas.

The TEOS gas cylinder 4 is arranged to supply a TEOS gas to the treatment furnace 6. The TEOS gas cylinder 4 is connected to the treatment furnace 6 via a pipe 4a and the pipe 3a. A variable flow rate valve $V_3$ is mounted to the pipe 4a so as to individually control the flow rate of the TEOS gas. The flow rate of the TEOS gas in the pipe is measured based on e.g. a difference between primary and secondary pressures of the valve $V_3$ and a cross-sectional area of the pipe 4a. Further, the pipe 4a is equipped with a gasification chamber 7. In the gasification chamber 7, the TEOS is heated to e.g. 70° C. or higher so that the TEOS, which is liquid at ordinary temperatures, is gasified in the gasification chamber 7 and then fed to the treatment furnace 6.

The nitrogen gas cylinder 5 is arranged to supply a nitrogen gas as a carrier gas for conveying the TEOS gas to the treatment furnace 6. Not only a nitrogen gas but also any other inert gas such as argon gas are usable as the carrier gas. The nitrogen gas cylinder 5 is connected to the treatment furnace 6 via a pipe 5a, the pipe 4a and the pipe 3a. A variable flow rate valve $V_4$ is mounted to the pipe 5a so as to individually control the flow rate of the nitrogen gas. The nitrogen gas supplied from the nitrogen gas cylinder 5 (or the other carrier gas) may be used to stir or purge the gases inside the treatment furnace 6.

In the treatment furnace 6, a workpiece 8 on which an oxide film is to be formed is placed. An oxide film (in the first embodiment, $SiO_2$ film) is formed on the workpiece 8 by chemical vapor deposition in the treatment furnace 6. The treatment furnace 6 is preferably a cold-wall-type furnace so as to suppress decomposition of the ozone gas etc. at a wall surface of the treatment furnace 6. A gas discharge pipe 9 is connected to the treatment furnace 6. The gas discharge pipe 9 is equipped with a vacuum pump 10 and a depollution unit 11 for decomposition of the vacuumed residual gases so that the gases inside the treatment furnace 6 are discharged into the air through the depollution unit 11. A variable flow rate valve $V_5$ is mounted to the gas discharge pipe 9 so as to control the pressure inside the treatment furnace 6 during the film deposition treatment process.

Figure 2:
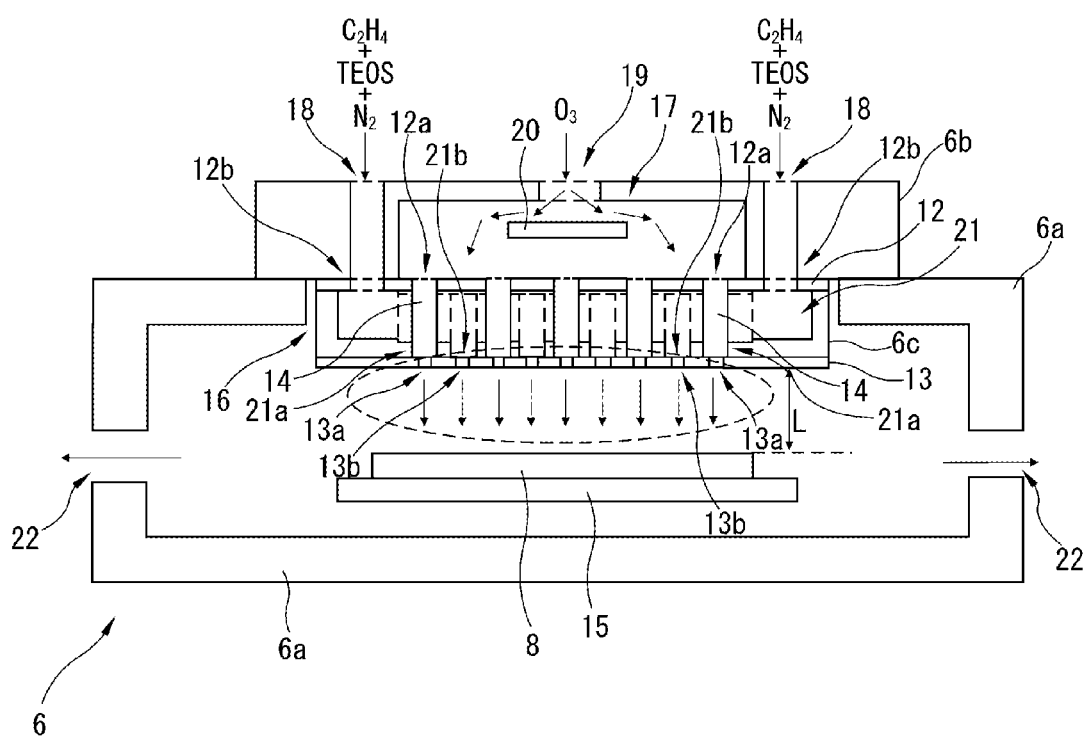
FIG. 2 is a cross-sectional view of a main part of the oxide film forming device according to the first embodiment of the present invention.

The details of the treatment furnace 6 are shown in FIG. 2. The treatment furnace 6 has: a furnace body 6a in which the workpiece 8 is placed; a furnace cover 6b;

and a mixed gas diffusion part 6c. A shield plate 12 is provided on a side of the furnace cover 6a facing the inside of the furnace body 6a. The mixed gas diffusion part 6c is disposed on the furnace cover 6b via the shield plate 12. A shower head plate 13 is provided on a side of the mixed gas diffusion part 6c opposite from the shield plate 12. Herein, the constituent parts of the treatment furnace 6 are structured and fixed to meet vacuum specifications such that the pressure inside the treatment furnace 6 reaches 1 Pa or lower.

The shield plate 12 has fanned therein holes 12a through which the ozone gas flows and holes 12b through which the mixed gas flows. Ozone gas passages 14 through which the ozone gas flows are provided on sides of the ozone gas flow holes 12a closer to the mixed gas diffusion part 6c. The ozone gas passage 14 is in the form of e.g. a cylindrical member. As the ozone gas flows through the hole 12a of the shield plate 12 and then through the ozone gas passage 14, the ozone gas is supplied into the furnace body 6a without being mixed with the other gases within the mixed gas diffusion part 6c.

The furnace body 6a is made of, for example, aluminum or SUS material (stainless steel) (the same goes for the furnace cover 6b, the mixed gas diffusion part 6c and the shield plate 12). A work stage 15 (heating susceptor) is disposed in the furnace body 6a so that the workpiece 8 is set on the work stage 15. The work stage 15 is made of, for example, aluminum, SUS material, quartz glass or SIC material. As a heater (not shown) for heating the work stage 15, an infrared light source used as heating mean in e.g. the semiconductor manufacturing technology is applied. The workpiece 8 is heated to a predetermined temperature by heating the work stage 15. The heater is preferably capable of heating to about 200° C.

The furnace cover 6b is arranged to close an opening formed in the upper portion of the furnace body 6a. An ozone gas buffer space 17 and mixed gas passages 18 are provided in the furnace cover 6b.

The ozone gas buffer space 17 has an opening on a side thereof closer to the furnace body 6a. The shield plate 12 is arranged to cover this opening. An ozone gas introduction part 19 to which the pipe 2a is connected is provided on the upper side of the ozone gas buffer space 17 so that the ozone gas is supplied from the pipe 2a into the ozone gas buffer space 17 through the ozone gas introduction part 19. A gas flow diffusion plate 20 is provided in the ozone gas buffer space 17.

The mixed gas passage 18 is formed through the furnace cover 6b. The pipe 3a is connected to an end of the mixed gas passage 18 facing the outside of the furnace body 6a. An end of the mixed gas passage 18 facing the inside of the furnace body 6a is brought into communication with the inside of the mixed gas diffusion part 6c through the hole 12b of the shield plate 12. Thus, the mixed gas of the ethylene gas, the TEOS gas and the nitrogen gas is supplied from the pipe 3a into the mixed gas diffusion part 6c through the mixed gas passage 18. Herein, at least one mixed gas passage 18 is provided around the ozone gas buffer space 17. When a plurality of mixed gas passages 18 are formed at evenly spaced intervals so as to surround the ozone gas buffer space 17, it is possible to reduce a deviation in the flow rate of the mixed gas. For example, the cross-sectional passage area of the mixed gas passage 18 is set to the same as that of the pipe 3a connected to the mixed gas passage 18.

The gas flow diffusion plate 20 is formed in e.g. a circular plate shape and is opposed to an opening of the ozone gas introduction part 19. The gas flow diffusion plate 20 can be mounted to a ceiling portion of the ozone gas buffer space 17 by a hook etc. Preferably, the gas flow diffusion plate 20 is set larger in size than the opening of the ozone gas introduction part 19 so as to prevent the ozone gas introduced from the ozone gas introduction part 19 from being directly blown onto the shield plate 12. Further, the diameter of the gas flow diffusion plate 20 is preferably about ½ of the lateral cross-sectional area of the ozone gas buffer space 17 in view of the fact that the larger the diameter of the gas flow diffusion plate 20, the higher the flow resistance of the ozone gas in the vicinity of the gas flow diffusion plate 20. The gas flow diffusion plate 20 is located at, or closer to the ozone gas introduction part 19 than, a midpoint between the ceiling portion of the ozone gas buffer space 17 and the shield plate 12. It is preferable that the thickness of the gas flow diffusion plate 20 is as small as possible.

The mixed gas diffusion part 6c is in the form of a box having an opening at an end thereof adjacent to the shield plate 12. A mixed gas diffusion space 21 is provided by an inner wall surface of the mixed gas diffusion part 6c and the shield plate 12. The mixed gas diffusion part 6c has, formed in an end surface thereof adjacent to the shower head plate 13, holes 21a through which the ozone gas flows and holes 21b through which the mixed gas flows. The ozone gas passages 14 are provided to the holes 21a.

The shower head plate 13 is opposed to a treatment target surface of the workpiece 8. The shower head plate 13 has formed therein holes 13a through which the ozone gas flows and holes 13b through which the mixed gas flows. The holes 13a, 13b are arranged in a periodical pattern (such as rectangular grid pattern, diagonal grid pattern, parallelepiped grid pattern, planar grid pattern, coaxial pattern etc.). The shower head plate 13 is made of, for example, aluminum, SUS material, quartz glass or SiC material. Preferably, the distance L from an end surface (gas supply surface) of the shower head plate 13 to the treatment target surface of the workpiece 8 is in a range of e.g. 1 mm to 100 mm, more preferably 5 mm to 30 mm, so as to form the CVD film (in the first embodiment, $SiO_2$ film) with less thickness deviation on the workpiece 8.

Figure 3:
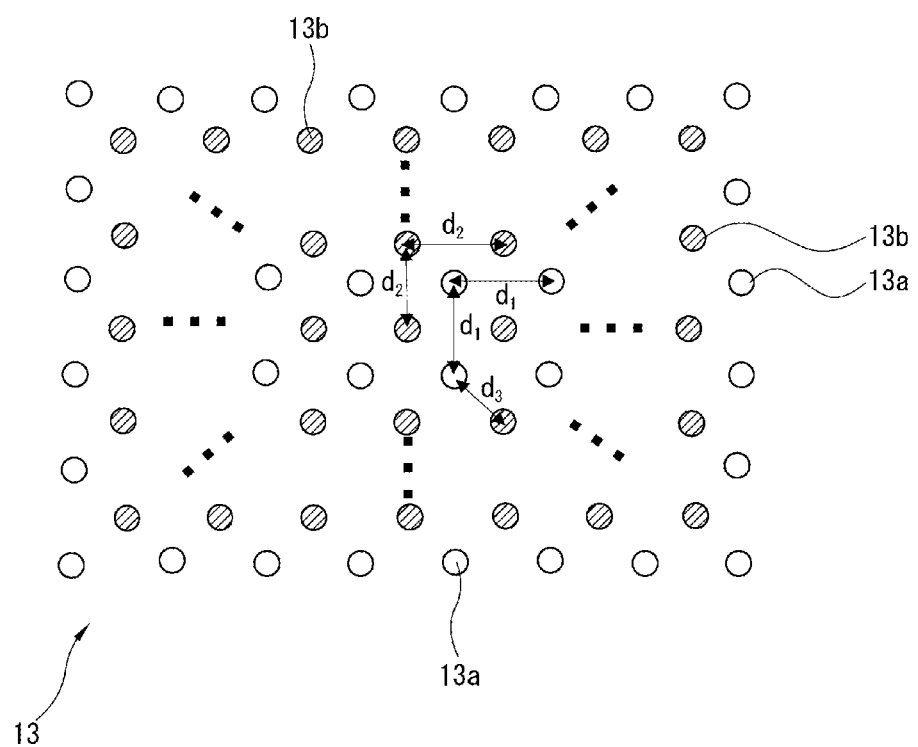
FIG. 3 is a plan view of a shower head of the oxide film forming device according to the first embodiment of the present invention.

For example, the holes 13a, 13b of the shower head plate 13 are arranged in a square grid pattern as shown in FIG. 3. In the example of FIG. 3, the holes 13a are arranged at evenly spaced intervals in a rectangular grid pattern in two directions perpendicular to each other (two vertical and horizontal directions indicated by $d_1$ in FIG. 3) along the treatment target surface of the workpiece 8; and the holes 13b are arranged at evenly spaced intervals in a rectangular grid pattern in directions respectively parallel to the aforementioned two directions (two vertical and horizontal direction indicated by $d_2$ in FIG. 3) at positions displaced from the holes 13a (e.g. displaced by a half of the arrangement interval of the holes 13a (toward the center of the rectangular grid pattern of the holes 13a)) along the treatment target surface of the workpiece 8. In this arrangement, the shower head plate 13 is configured such that either one of the holes 13a and the holes 13b are located closer than the other holes to the center of the rectangular grid pattern of the other holes (e.g. the holes 13b are located closer to the center of the rectangular grid pattern of the holes 13a than the holes 13a).

The arrangement pattern of the holes 13a, 13b of the shower head plate 13 is varied depending on the shape of the workpiece 8. In the case where the workpiece 8 is circular in shape, for example, the holes 13a and 13b are alternately arranged on circumferences of circles of different radii. The grid interval $d_1$, $d_2$ of the holes 13a, 13b is preferably in a range of e.g. 1 mm to 100 mm, more preferably 5 mm to 30 mm. Further, the interval $d_3$ between the holes 13a and 13b is preferably in a range of e.g. 0.7 mm to 71 mm, more preferably 3.5 mm to 22 mm. Each of these intervals $d_1$ to $d_3$ refers to a distance between the centers of the holes 13a, 13b. By appropriately setting the interval dimensions of the holes 13a and 13b as mentioned above, it is possible to fowl the $SiO_2$ film with less thickness deviation on the workpiece 8.

The hole diameter (diameter ϕ) of the holes 13a, 13b is preferably in a range of e.g. 0.1 mm to 10 mm, more preferably 0.5 to 2 mm. The hole diameters of the holes 13a and 13b are set according to the shapes of the ozone gas buffer space 17 and the mixed gas buffer space 21. In the case where the ozone gas buffer space 17 or the mixed gas buffer space 21 cannot be provided with a large size, for example, the gas flow rate and pressure tend to be nonuniform. In such a case, the hole diameter of the holes 13a or 13b is made smaller so as to increase pressure loss and thereby improve the uniformity of the gas distribution in the ozone gas buffer space 17 or the mixed gas buffer space 21.

The holes 13a for flow of the ozone gas may be provided along the outer periphery of the shower head plate 13 so as to enclose the holes 13a and 13b. In other words, the holes 13a for flow of the ozone gas may be provided in the outermost peripheral region of the shower head plate 13. In this case, an unreacted substance, which is likely to be adsorbed onto the wall of the furnace body 6a, is exposed to the ozone gas. As a consequence, the reaction between the unreacted substance and the ozone gas is promoted so that the unreacted substance is prevented from being adsorbed onto the wall of the furnace body 6a or the inner wall of the discharge pipe.

As shown by arrows in FIG. 2, the ozone gas is fed into the ozone gas introduction part 19 through the pipe 2a. The ozone gas fed into the ozone gas introduction part 19 is introduced and diffused into the ozone gas buffer space 17. The size of the ozone gas buffer space 17 is set such that the flow rate and pressure of the ozone gas flowing through the respective holes 12a of the shield plate 12 and the respective ozone gas passages 14 become uniform. It is preferable that the volumetric capacity of the ozone gas buffer space 17 is as large as possible. For example, the volumetric capacity of the ozone gas buffer space 17 is set larger than or equal to ½ of the space between the gas supply surface of the shower head plate 13 and the treatment target surface of the workpiece 8 so as to uniformize the gas flow rate and pressure distribution of the ozone gas. Further, the flow rate and pressure distribution of the ozone gas flowing through the respective holes 12a of the shiled plate 12 and the respective ozone gas passages 14 are more uniformized as the gas flow diffusion plate 20 is disposed in the ozone gas buffer space 17. The ozone gas reaching the shower head plate 13 is ejected toward the workpiece 8 through the holes 13a.

On the other hand, the mixed gas (more specifically, the mixed gas of the ethylene gas, the TEOS gas and the nitrogen gas) is introduced from the pipe 3a into the respective mixed gas passages 18. The mixed gas introduced into the mixed gas passages 18 is diffused into the mixed gas buffer space 21. The size of the mixed gas buffer space 21 is set such that the flow rate and pressure of the mixed gas passing through the respective holes 21b of the mixed gas diffusion part 6c and the respective holes 13b of the shower head plate 13 become uniform. It is preferable that the volumetric capacity of the mixed gas buffer space 21 is as large as possible. For example, the volumetric capacity of the mixed gas buffer space 21 is set larger than or equal to ½ of the space between the gas supply surface of the shower head plate 13 and the treatment target surface of the workpiece 8 so as to uniformize the gas flow rate and pressure distribution of the mixed gas.

The ozone gas and the mixed gas ejected from the shower head plate 13 reach the workpiece 8 while being mixed together and chemically reacted in the space between the shower head plate 13 and the workpiece 8. The gas supplied to the workpiece 8 and the gas after the reaction flow in a direction toward the outer periphery of the workpiece 8, and then, get discharged to the outside of the treatment furnace 6 through a plurality of discharge holes 22 which are foamed in the side wall of the furnace body 6a.

An oxide film forming method implemented by the oxide film forming device 1 according to the first embodiment of the present invention will be now described in detail below.

The ozone gas, the raw material gas containing the film constituent element and the unsaturated hydrocarbon gas are supplied into the treatment furnace 6 in which the workpiece 8 is placed, whereby the oxide film is formed on the workpiece 8 by chemical vapor deposition (CVD).

The workpiece 8 is in the form of a substrate, a film or the like. Since the oxide film forming method using the ozone gas and the unsaturated hydrocarbon gas enables formation of the oxide film even under low-temperature conditions, the oxide film can be formed on not only a relatively high heat-resistant substrate such as Si substrate but also a substrate or film of relatively low heat-resistant synthetic resin. Specific examples of the synthetic resin usable as the material of the substrate or film include polyester resin, aramid resin, olefin resin, polypropylene, PPS (polyphenylene sulfide) and PET (polyethylene terephthalate). As other examples of the synthetic resin, there can also be used PE (polyethylene), POM (polyoxymethylene or acetal resin), PEEK (poly ether ether ketone), ABS resin (acrylonitrile-butadiene-styrene copolymerized synthetic resin), PA (polyarnide), PFA (tetrafluoroethylene-perfluoroalkoxyethylene copolymer), PI (polyimide), PVD (polyvinyldichloride) and the like.

It is preferable that the ozone concentration of the ozone gas is as high as possible. The ozone concentration (in volume %) of the ozone gas is preferably in a range of 20 to 100 vol %, more preferably 80 to 100 vol %. The reason for this is that, as the ozone concentration of the ozone gas is closer to 100 vol %, a reactive species (OH) generated from the ozone reaches the surface of the workpiece at a higher density. The reactive species (OH) not only participates in the reaction required for chemical vapor deposition, but also reacts with carbon (C) contained as an impurity in the film so as to remove the impurity carbon (C) in gaseous form. Consequently, the oxide film is formed with less impurity by supplying a larger amount of the reactive species (OH) to the surface of the workpiece. In view of the tendency that the higher the ozone concentration of the ozone gas (i.e. the lower the oxygen concentration of the ozone gas), the longer the lifetime of atomic oxygen (O) generated by dissociation of the ozone, it is preferable to use the ozone gas of high concentration. More specifically, the oxygen concentration is decreased with increase of the ozone concentration so that the atomic oxygen (O) is prevented from being deactivated by collision with the oxygen molecule. Further, the process pressure during the oxide film deposition treatment process can be decreased with increase of the ozone concentration. It is thus preferable to use the high-concentration ozone gas from the viewpoint of gas flow control and gas flow improvement.

The flow rate of the ozone gas is preferably in a range of e.g. 0.2 sccm or higher, more preferably 0.2 to 1000 sccm. The unit "sccm" expresses sec (cm$^3$min) at 1 atm (101.3 hPa) and 25° C. Furthermore, it is preferable that the flow rate (supply amount) of the ozone gas is set equal to or more than twice the flow rate (supply amount) of the unsaturated hydrocarbon gas. The reason for this is that, since the decomposition of the unsaturated hydrocarbon gas to OH group proceeds in a plurality of steps, a sufficient amount of OH group may not be obtained due to shortage of the ozone molecule required for the reaction in the case where the ozone gas and the unsaturated hydrocarbon gas are supplied at a ratio of ozone molecule:unsaturated hydrocarbon molecule=1:1. At the time when the unsaturated hydrocarbon gas and the raw material gas are supplied, the flow rate of the ozone gas is preferably set equal to or more than twice the total flow rate of the unsaturated hydrocarbon gas and the raw material gas so as to form the oxide film at a good deposition rate.

The high-concentration ozone gas can be obtained by liquefying and separating ozone from an ozone-containing gas on the basis of a difference in vapor pressure, and then, gasifying the liquefied ozone. As a device for generating the high-concentration ozone gas, there can be used any of ozone gas generators disclosed in patent documents such as Japanese Laid-Open Patent Publication No. 2001-304756 and Japanese Laid-Open Patent Publication No. 2003-20209. These high-concentration ozone gas generators are each configured to generate a high-concentration ozone gas (ozone concentration 100 vol %) by isolating ozone through liquefaction separation based on a difference in vapor pressure between ozone and another gas (e.g. oxygen). The ozone gas generator, particularly of the type having a plurality of chambers for liquefying and gasifying only ozone, enables continuous supply of the high-concentration ozone gas by individual temperature control of the chambers. One commercially available example of the high-concentration ozone gas generator is Pure Ozone Generator (MPOG-HM1A1) manufactured by Meidensha Corporation.

The raw material gas used is a gas containing as a component thereof any element(s) which constitutes the oxide film (such as lithium (Li), magnesium (Mg), silicon (Si), titanium (Ti), vanadium (V), chromium (Cr), manganese (Mn), iron (Fe), cobalt (Co), nickel (Ni), copper (Cu), zinc (Zn), gallium (Ga), germanium (Ge), yttrium (Y), zirconium (Zr), molybdenum (Mo), ruthenium (Ru), rhodium (Rh), indium (In), tin (Sn), tungsten (W), iridium (Ir), platinum (Pt), lead (Pb) and the like; hereinafter also generically referred to as "metal" or "metal element"). For example, there can be used a raw material gas containing an organic silicon compound having a Si—O bond or Si—C bond or an organic metal compound having a metal-oxygen bond or metal-carbon bond, or a raw material gas composed of a metal halide, an organic metal complex, a hydride of silicon or metal etc. Specific examples of the raw material gas are gases of silane (that is a generic name for hydrogen silicate), TEOS (tetraethyl orthosillicate), TMS (trimethoxysilane), TES (triethoxysilane), TMA (trimethylalminium), TEMAZ (tetrakis(ethylmethylamino)zirconium), tungsten fluoride (WF$_6$) and the like. As the raw material gas, there can alternatively be used a gas of heterogeneous polynuclear complex containing a plurality of kinds of metal elements (as disclosed in e.g. Japanese Laid-Open Patent Publication No. 2016-210742) rather than containing one kind of metal element. The flow rate of the raw material gas is preferably in a range of e.g. 0.1 sccm or higher, more preferably 0.1 to 500 sccm.

The unsaturated hydrocarbon gas used is a gas of double bond-containing hydrocarbon (also called alkene) such as ethylene or triple bond-containing hydrocarbon (also called alkyne) such as acetylene. In addition to ethylene and acetylene, a gas of low-molecular-weight unsaturated hydrocarbon (e.g. unsaturated hydrocarbon having a carbon number n of 4 or less) such as butylene is also suitably usable as the unsaturated hydrocarbon gas. The flow rate of the unsaturated hydrocarbon gas is preferably in a range of e.g. 0.1 sccm or higher, more preferably 0.1 to 500 sccm.

Figure 4:
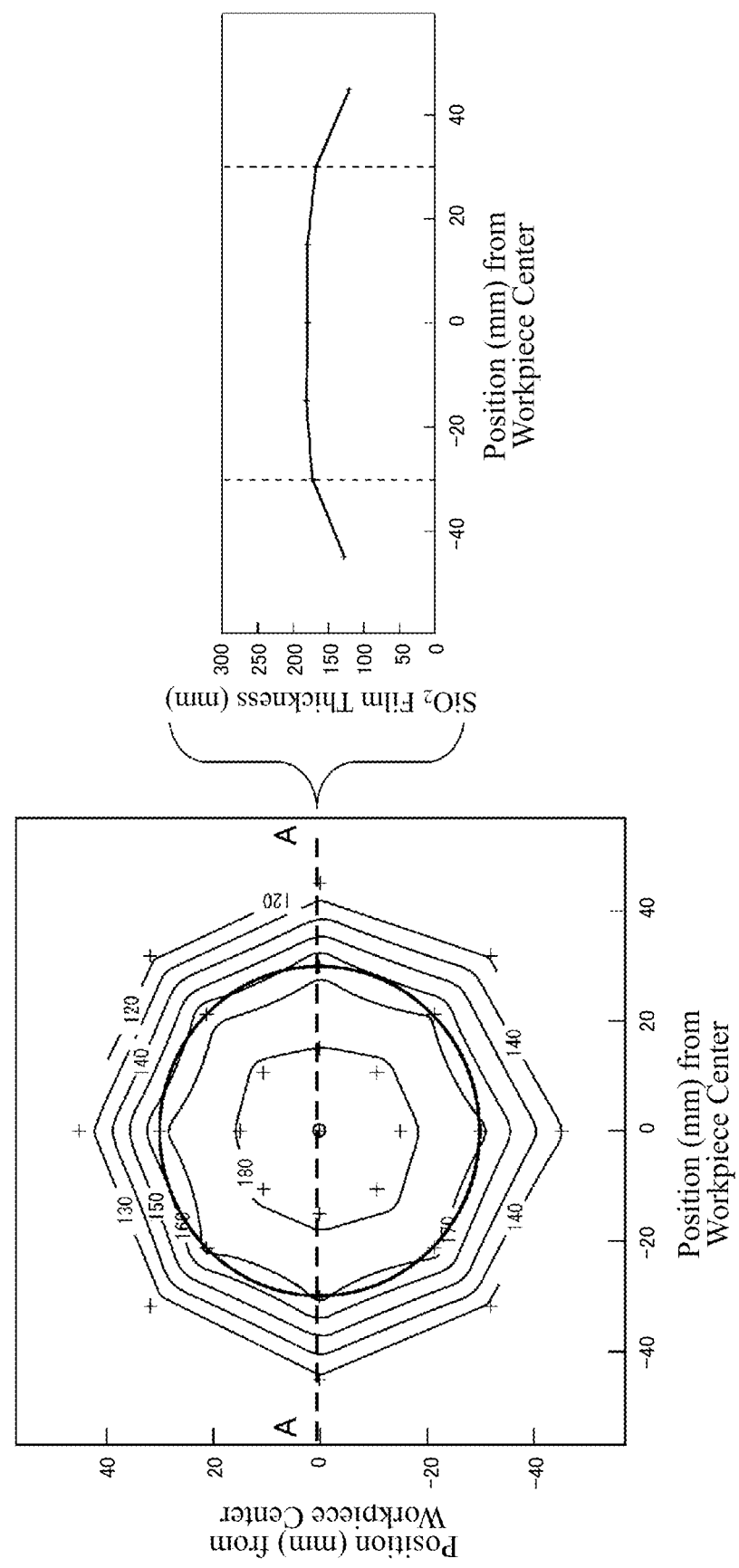
FIG. 4(a) is a diagram showing results of thickness measurement of a $SiO_2$ film in a planar direction.
FIG. 4(b) is a diagram showing the results of thickness measurement of the $SiO_2$ film as taken in A-A cross section.

The thickness distribution of a SiO$_2$ film formed by the oxide film forming device 1 is shown in FIG. 4. The oxide film forming device 1 used was of the type capable of performing film deposition treatment on the workpiece 8 of 75 mm diameter 4). In this embodiment example, a Si substrate was used as the workpiece 8. For the formation of the SiO$_2$ film, the film deposition treatment was performed for 3 minutes under the conditions that: the flow rate of the ozone gas (concentration: 100 vol %) was 100 seem; the flow rate of the ethylene gas was 64 sccm; the flow rate of the TEOS gas was 1 seem; the flow rate of the nitrogen gas was 15 sccm; and the pressure inside the treatment furnace 6 was about 30 Pa.

As shown in FIG. 4(*a*), the film had a film thickness distribution with a uniformity of ±5% in a range surrounded by a solid line (i.e. within a diameter φ of 60 mm with respect to the center of the substrate). More specifically, as shown in FIG. 4(*b*), the thickness of the film was uniform within the range of 30 mm from the center of the substrate; and, in a peripheral region of the substrate, the thickness of the film was decreased with increase in distance from the center of the substrate. The reason for this is assumed to be that, since it took time for the gases ejected from the shower head plate 13 to reach the peripheral region of the substrate, a part of the CVD reaction was over before the gases reached the peripheral region of the substrate.

Figure 5:
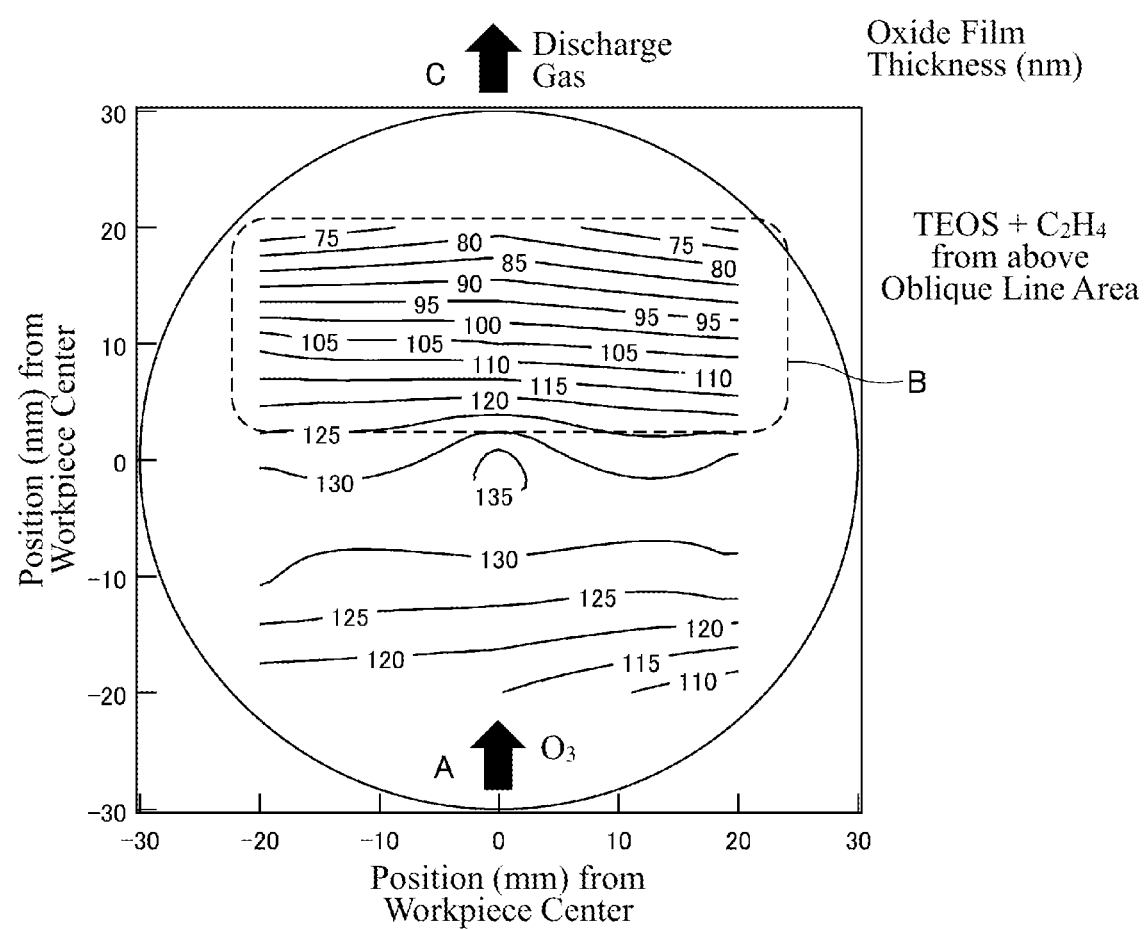
FIG. 5 is a diagram showing results of thickness measurement of a $SiO_2$ film formed without the use of a shower head.

The result of formation of an oxide film (that is, the thickness distribution (nm) of a SiO$_2$ film) on the workpiece 8 (8-inch Si wafer) by chemical vapor deposition at room temperature (25° C.) without the use of the shower head plate 13 is shown in FIG. 5. The film deposition range of FIG. 5 corresponds to the range surrounded by the solid line in FIG. 4. In the figure, Arrow A indicates the position of supply of the ozone gas; and Range B surrounded by a dotted line indicates the position of supply of the ethylene gas and the TEOS gas. The ethylene gas and the TEOS gas were supplied to the treatment target surface of the workpiece 8 from above the treatment target surface. Further, Arrow C indicates the position of the discharge port 22. The oxide film deposition treatment was performed for 3 minutes under the conditions that: the flow rate of the ozone gas was 100 sccm; the flow rate of the ethylene gas was 64 sccm; the flow rate of the TEOS gas was 03 sccm; the flow rate of the nitrogen gas was 15 sccm; and the pressure inside the treatment furnace 6 was about 50 Pa. The maximum film thickness of the oxide film was 138 nm. The maximum film deposition rate was 46 mn/min.

As shown in FIG. 5, the oxide film (SiO$_2$ film) was formed at a high film deposition rate even without the use of the shower head plate 13. However, the film deposition treatment mostly took place on the center region of the workpiece 8 where the ozone gas and the mixed gas came into collision with each other. The thickness of an end portion of the oxide film on the downstream side of the ozone gas flow was only half of that of a center portion of the oxide film. The reason for this is assumed to be that the ozone was consumed by the oxide film deposition reaction on the center region of the workpiece whereby the film deposition treatment did not proceed on the end region of the workpiece.

Next, the oxide film forming device according to the second embodiment of the present invention will be described in detail below with reference to FIG. 6. The oxide film forming device according to the second embodiment of the present invention is different from the oxide film forming device according to the first embodiment, in the configuration of a shower head plate 23. Hence, the same configurations as those of the oxide film forming device according to the first embodiment are designated by the same reference numerals; and the following description will be focused on the differences in configuration between the first and second embodiments. In the oxide film forming device according to the second embodiment of the present invention, the shower head plate 23 has a rectangular ejection hole structure (slit structure) for supply of ozone gas and mixed gas to a workpiece 8.

The oxide film forming device according to the second embodiment of the present invention includes a treatment furnace 6. The treatment furnace 6 has a furnace body 6a, a furnace cover 6b and a mixed gas diffusion part 6c. A shield plate 12 is provided on a side of the furnace cover 6b facing the inside of the furnace body 6a. The mixed gas diffusion part 6c is disposed on the furnace cover 6b via the shield plate 12. The shower head plate 23 is provided on a side of the mixed gas diffusion part 6c opposite from the shield plate 12.

The shower head plate 23 is opposed to a treatment target surface of the workpiece 8. The shower head plate 23 is made of, for example, aluminum, SUS material, quartz glass or SiC material. The distance L from an end surface (gas supply surface) of the shower head plate 23 to the treatment target surface of the workpiece 8 is preferably in a range of e.g. 1 mm to 100 mm, more preferably 5 mm to 30 mm, so as to form a CVD film (in the second embodiment, SiO$_2$ film) with less thickness deviation on the workpiece 8.

Figure 6:
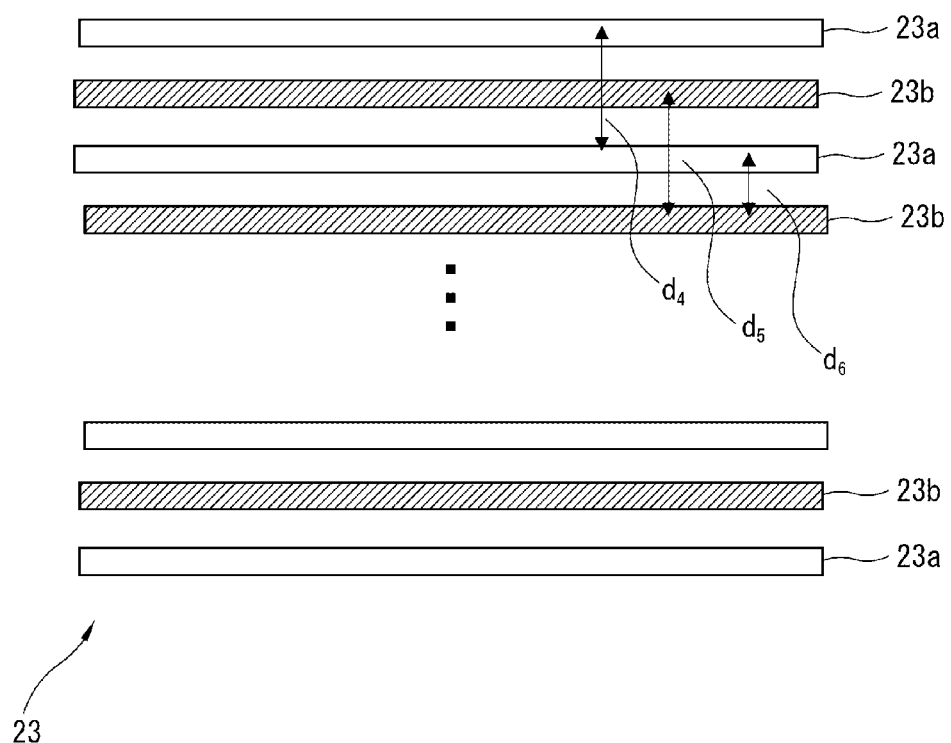
FIG. 6 is a plan view of a shower head of an oxide film forming device according to a second embodiment of the present invention.

As shown in FIG. 6, the shower head plate 23 has formed therein slits 23a through which the ozone gas flows and slits 23b through which the mixed gas (more specifically, the mixed gas of ethylene gas, TEOS gas and nitrogen gas) flows. The sits 23a and the slits 23b are alternately arranged side by side in a short-dimension direction of the slits 23a, 23b. The interval $d_4$ between the slit 23a and the slit 23a and the interval $d_5$ between the slit 23b and the slit 23b are preferably in a range of 1 mm to 100 mm, more preferably 5 mm to 50 mm. The interval $d_6$ between the slit 23a and the slit 23b is preferably in a range of 0.5 mm to 50 mm, more preferably 2.5 to 25 mm. Each of these intervals $d_4$ to $d_5$ refers to a distance between the centers of the slits.

The slit width of the slits 23a, 23b (that is, the opening width of the slits 23a, 23b in the short-dimension direction) is preferably in a range of 0.1 mm to 10 mm, more preferably 0.5 mm to 2 mm. The slit widths of the slits 23a and 23b are set according to the shapes of the ozone gas buffer space 17 and the mixed gas buffer space 21. In the case where the ozone gas buffer space 17 or the mixed gas buffer space 21 cannot be provided with a large size so that the gas flow rate and pressure does not become uniform, the slit width of the slits 23a or 23b is made smaller so as to increase pressure loss and thereby improve the uniformity of the gas distribution in the ozone gas buffer space 17 or the mixed gas buffer space 21. The slit length of the slits 23a, 23b is set appropriately according to the size of the workpiece 8. When the slits 23a for flow of the ozone gas are provided as the outermost slits (in FIG. 6, the uppermost and lowermost slits), the reaction between adsorptive unreacted substance and the ozone gas is promoted so that the unreacted substance is prevented from being adsorbed onto the wall of the furnace body 6a or the inner wall of the discharge pipe.

In the case where the slits 23a, 23b are formed in the shower head plate 23, the ozone gas passage for communication between the ozone gas buffer space 17 and the inside of the furnace body 6a is defined as a rectangular parallelepiped passage having the same cross section as that of the slits 23a. The mixed gas in the mixed gas buffer space 21 flows to bypass the ozone gas passage. The mixed gas passages 18 formed in the furnace cover 6b are located so as to sandwich the slits 23a and 23b in a direction of alignment of the slits 23a and 23b. For example, the ozone gas passages 18 are provided in the furnace cover 6b at upper and lower positions in FIG. 6.

As described above, each of the oxide film forming devices according to the first and second embodiments of the present invention has a shower head structure whereby the film thickness distribution of the oxide film formed on the workpiece 8 is more uniformized by setting the distance between the gas supply surface of the shower head plate 13, 23 and the treatment target surface of the workpiece 8 and the dimensions of the holes 13a and 13b or the slits 23a and 23b formed in the shower head plate 13, 23 to predetermined values. Since the oxide film is uniformly formed centering on a portion of the workpiece 8 opposed to the center of the shower head plate 13, 23, it is possible to form the uniform oxide film at a target position on the workpiece 8. As a result, the oxide film is formed not only at a high film deposition rate but also with uniformity even on a large-area substrate. Each of the oxide film forming devices according to the first and second embodiments of the present invention is therefore suitable as a device for forming an oxide film with a more uniform film thickness distribution on the workpiece 8 not only in the case where the workpiece 8 is small with e.g. a diameter of 6 cm, but also in the case where the workpiece 8 has a large area with a diameter of 10 cm or larger, especially 30 cm or larger.

The reactive species generated by the reaction of the ozone and the unsaturated hydrocarbon has a short lifetime and thus needs to be efficiently reacted with the raw material gas on the surface of the workpiece 8. In each of the oxide film forming devices according to the first and second embodiments of the present invention, the reactive species is generated by mixing the ozone gas and the mixed gas after the ozone gas and the mixed gas pass through the shower head plate 13, 23. The oxide film is more uniformly formed on the workpiece 8 by supplying the generated reactive species and the raw material gas uniformly onto the treatment target surface of the workpiece 8.

In the film deposition treatment process, there occurs an adsorbed substance on the shower head plate 13, 23. When the shower head plate 13, 23 is detachably disposed in the furnace 6, it is possible to periodically detach and replace or clean the shower head plate 13, 23.

Each of the oxide film forming devices according to the first and second embodiments of the present invention enables formation of the oxide film on the workpiece 8 even under low-temperature conditions of 200° C. or lower. Consequently, it is possible to form the oxide film on the workpiece 8 even when the workpiece 8 (substrate or film) is made of any material low in heat resistant temperature (as exemplified by organic material such as synthetic resin).

Since the oxide film is formed on the workpiece 8 without using a plasma in present invention, damage to the workpiece 8 is suppressed. It is thus possible to, even in the case where a thin film (such as an undercoating film for an electronic device (as typified by an organic thin film)) is formed in advance of the formation of an oxide film (such as SiO$_2$ film) on an electronic device or organic film, form the oxide film on the electronic device or organic film without causing damage such as electrical breakdown to the thin film.

Furthermore, each of the oxide film forming devices according to the first and second embodiments of the present invention enables formation of the oxide film at a high film deposition rate under the process conditions of 200° C. or lower. The oxide film formed in the above-mentioned embodiment example had a pressure resistance of 5 MV/cm. It is hence apparent that the oxide film is formed with high pressure resistance and good gas barrier properties by the oxide film forming method according to the embodiments of the present invention.

Conventionally, the temperature of film deposition on a material where gas barrier properties are required is 80° C. or lower. The oxide film forming devices according to the first and second embodiments of the present invention are suitably applicable to the formation of oxide films on materials where gas barrier properties are required.

Although the oxide film forming device according to the present invention has been described above by way of the specific embodiments, the oxide film forming device according to the present invention is not limited to those specific embodiments, Various modifications and variations of the above-described embodiments are possible within the range that does not impair the features of the present invention. All such modifications and variations fall within the technical scope of the present invention.

For example, it is an alternative embodiment to supply the mixed gas through the center portion of the furnace cover although the ozone gas is supplied through the center portion of the furnace cover in each of the above-described embodiments. In another alternative embodiment, the mixed gas may be supplied by separately introducing the gases into the treatment furnace and mixing these gases together in the treatment furnace. In still another alternative embodiment, the shower head plate may have formed therein holes from which the ozone gas, the unsaturated hydrocarbon gas and the raw material gas are ejected, respectively. In this case, a gas buffer space may be provided between each gas supply pipe and the shower head plate as in the case of the above-described embodiments. In the case where the shower head plate has formed therein holes for ejecting the ozone gas, the unsaturated hydrocarbon gas and the raw material gas, respectively, it is possible to form a uniform oxide film on the workpiece by setting the distance between the shower head plate and the workpiece, the intervals between the holes for ejection of the ozone gas and the holes for ejection of the unsaturated hydrocarbon gas and the raw material gas and the hole diameters holes of the holes for ejection of the respective gases within the same ranges as those in the above-described embodiments.

The invention claimed is:

1. An oxide film forming device for forming an oxide film on a workpiece, comprising:
    a treatment furnace in which the workpiece is placed; and
    a shower head arranged facing a treatment target surface of the workpiece,
    wherein the shower head comprises:
    first slits for supplying an ozone gas to the workpiece; and
    second slits for supplying to the workpiece an unsaturated hydrocarbon gas, a raw material gas containing a Si element or metal element which is a constituent element of the oxide film, or a mixed gas of the unsaturated hydrocarbon gas and the raw material gas,
    wherein the first slits and the second slits are alternately arranged side by side in a short-dimension direction of the slits,
    wherein a gas supply surface of the shower head is opposed to the treatment target surface of the workpiece at a distance of 1 mm to 100 mm away from the treatment target surface,
    wherein a slit width of the first slits and a slit width of the second slits are larger than or equal to 0.1 mm and smaller than or equal to 10 mm and are different from each other, and
    wherein an interval between slit centers of adjacent ones of the first slits and an interval between slit centers of adjacent ones of the second slits are larger than or equal to 1 mm and smaller than or equal to 100 mm.

2. The oxide film forming device according to claim 1, wherein the treatment furnace comprises:
    a first gas supply port for supplying therethrough the ozone gas; and
    a second gas supply port for supplying therethrough the unsaturated hydrocarbon gas, the raw material gas or the mixed gas, and
    wherein the oxide film forming device comprises:
    a first gas buffer space formed between the first gas supply port and the shower head to allow diffusion of the ozone gas; and
    a second gas buffer space formed between the second gas supply port and the shower head to allow diffusion of the unsaturated hydrocarbon gas, the raw material gas or the mixed gas.

3. The oxide film forming device according to claim 1, wherein outermost ones of the first and second slits of the shower head are the first slits.

4. The oxide film forming device according to claim 1, wherein the shower head is in the form of a plate and is detachably disposed in the treatment furnace.

* * * * *